United States Patent
Kim et al.

(10) Patent No.: US 6,624,463 B2
(45) Date of Patent: Sep. 23, 2003

(54) SWITCHING FIELD EFFECT TRANSISTOR USING ABRUPT METAL-INSULATOR TRANSITION

(76) Inventors: Hyun-Tak Kim, Semiconductor Basic Research Lab. ETRI, Taejon 305-350 (KR); Kwang-Yong Kang, Semiconductor Basic Research Lab. ETRI, Taejon 305-350 (KR)

( * ) Notice: Subject to any disclaimer, the term of this patent is extended or adjusted under 35 U.S.C. 154(b) by 0 days.

(21) Appl. No.: 10/188,522

(22) Filed: Jul. 2, 2002

(65) Prior Publication Data

US 2003/0054615 A1 Mar. 20, 2003

(30) Foreign Application Priority Data

Sep. 17, 2001 (KR) .......................................... 2001-57176

(51) Int. Cl.[7] ............................................. H01L 29/772
(52) U.S. Cl. .......................................... 257/310; 257/192
(58) Field of Search ................................... 257/192, 310

(56) References Cited

U.S. PATENT DOCUMENTS

| | | | | |
|---|---|---|---|---|
| 6,121,642 A | * | 9/2000 | Newns ....................... | 257/192 |
| 6,198,119 B1 | * | 3/2001 | Nabatame et al. .......... | 257/295 |
| 6,259,114 B1 | | 7/2001 | Misewich et al. ........... | 257/43 |
| 6,518,609 B1 | * | 2/2003 | Ramesh ...................... | 257/295 |
| 2001/0050409 A1 | * | 12/2001 | Kasahara .................... | 257/532 |

FOREIGN PATENT DOCUMENTS

JP 1999-036644 5/1999

OTHER PUBLICATIONS

Mott Transition field effect transistor by DM Newns; Applied physics letters Aug. 10, 1998 pp. 780–782.
A field effect transistor based on the Mott transition in a molecular layer by C. Zhou; Applied physics letters Feb. 3, 1997 pp. 598–600.

* cited by examiner

Primary Examiner—Allan R. Wilson

(57) ABSTRACT

A switching field effect transistor includes a substrate; a Mott-Brinkman-Rice insulator formed on the substrate, the Mott-Brinkman-Rice insulator undergoing abrupt metal-insulator transition when holes added therein; a dielectric layer formed on the Mott-Brinkman-Rice insulator, the dielectric layer adding holes into the Mott-Brinkman-Rice insulator when a predetermined voltage is applied thereto; a gate electrode formed on the dielectric layer, the gate electrode applying the predetermined voltage to the dielectric layer; a source electrode formed to be electrically connected to a first portion of the Mott-Brinkman-Rice insulator; and a drain electrode formed to be electrically connected to a second portion of the Mott-Brinkman-Rice insulator.

9 Claims, 4 Drawing Sheets

SWITCHING FIELD EFFECT TRANSISTOR USING ABRUPT METAL-INSULATOR TRANSITION

BACKGROUND OF THE INVENTION

1. Field of the Invention

The present invention relates to a field effect transistor, and more particularly, to a switching field effect transistor (FET) using abrupt metal-insulator transition.

2. Description of the Related Art

Metal Oxide Semiconductor Field Effect Transistors (MOSFETs) have been widely used as micro and super-speed switching transistors. A MOSFET has two pn junction structures showing linear characteristics at a low drain voltage as a basic structure. However, when a channel length is reduced to about 50 nm or below as the degree of integration of a device increases, an increase in a depletion layer changes the concentration of a carrier and an decrease of the depth of the gate insulator remarkably makes current flowing between a gate and a channel.

To overcome this problem, IBM institute has performed Mott FETs using the Mott-Hubbard insulator in a channel layer in reference "D. M. Newns, J. A. Misewich, C. C. Tsuei, A. Gupta, B. A. Scott, and A. Schrott, Appl. Phys. Lett. 73, 780 (1998)". The Mott-Hubbard insulator undergoes a transition from an antiferromagnetic insulator to an metal. This transition is called the Mott-Hubbard metal-insulator transition in reference "J. Hubbard, Proc. Roy. Sci. (London) A276, 238 (1963), A281, 401 (1963)". This is a continuous (or second order) phase transition. Unlike MOSFETs, Mott FETs perform an ON/OFF operation according to metal-insulator transition and do not have a depletion layer, thereby remarkably improving the degree of integration of a device and achieving a higher-speed switching characteristic than MOSFETs.

Since Mott-Hubbard FETs use continuous metal-insulator transition, charges used as carriers should be continuously added until the best metallic characteristics reach. Accordingly, the added charges must have a high concentration. Generally, charges N per unit area can be expressed by Equation (1).

$$N = \frac{\varepsilon}{ed} V_g \quad (1)$$

Here, "$\varepsilon$" denotes the dielectric constant of a gate insulator, "e" denotes a basic charge, "d," denotes the thickness of the gate insulator, and "$V_g$" denotes a gate voltage.

For example, in the case of $La_2CuO_4$, which is one of the materials falling under the group Mott-Hubbard insulator, when holes are added to $La_2CuO_4$, the characteristics of $La_{2-x}Sr_xCuO_4$(LSCO) appear, and a metal having best hole carriers at x=0.15 (15%) is obtained. Here, the added holes become carriers. Generally, x=0.15 is a high concentration, so if the N value increases, the dielectric constant of the gate insulator increases, the thickness of the gate insulator decreases, or the gate voltage increases. However, when the dielectric constant is too great, the fatigue characteristics of a dielectric sharply worsens during a high-speed switching operation, thereby reducing the life of a transistor. Moreover, there is a limit in decreasing the thickness of the gate insulator due to limitations in fabrication processes. In addition, when the gate voltage increases, power consumption also increases, which makes it difficult to be the transistor with a low power.

SUMMARY OF THE INVENTION

To solve the above-described problems, it is an object of the present invention to provide a switching field effect transistor using abrupt metal-insulator transition so that the field effect transistor shows metallic characteristics even if holes of a low concentration are added thereto.

To achieve the above object of the invention, there is provided a field effect transistor including a substrate; a Mott-Brinkman-Rice insulator formed on the substrate, the Mott-Brinkman-Rice insulator undergoing abrupt metal-insulator transition when holes add therein; a dielectric layer formed on the Mott-Brinkman-Rice insulator, the dielectric layer adding holes into the Mott-Brinkman-Rice insulator when a predetermined voltage is applied thereto; a gate electrode formed on the dielectric layer, the gate electrode applying the predetermined voltage to the dielectric layer; a source electrode formed to be electrically connected to a first portion of the Mott-Brinkman-Rice insulator; and a drain electrode formed to be electrically connected to a second portion of the Mott-Brinkman-Rice insulator.

Preferably, the substrate is formed of $SrTiO_3$.

Preferably, the Mott-Brinkman-Rice insulator is formed of $LaTiO_3$, $YTiO_3$, $Ca_2RuO_4$, $Ca_2IrO_4$, $V_2O_3$, $(Cr_xV_{1-x})_2O_3$, $CaVO_3$, $SrVO_3$ and $YVO_3$.

Preferably, the dielectric layer is formed of $Ba_{1-x}Sr_xTiO_3$ or dielectric materials.

Preferably, the source electrode and the drain electrode are separated from each other by the dielectric layer.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Hereinafter, embodiments of the present invention will be described in detail with reference to the attached drawings. The present invention is not restricted to the following embodiments, and many variations are possible within the spirit and scope of the present invention.

The following description concerns the operating principle of a field effect transistor (FET) according to the present invention.

Figure 1A:
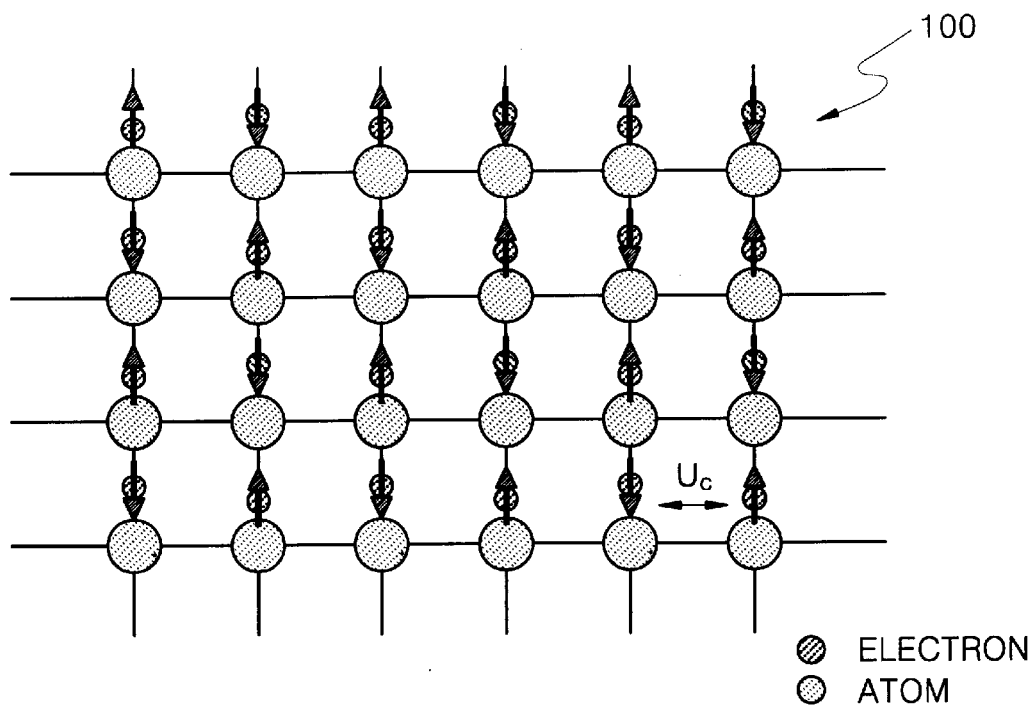
FIGS. 1A and 1B are diagrams showing atomic lattices within a Mott-Brinkman-Rice insulator having abrupt metal-insulator transition under predetermined conditions.
Figure 1B:
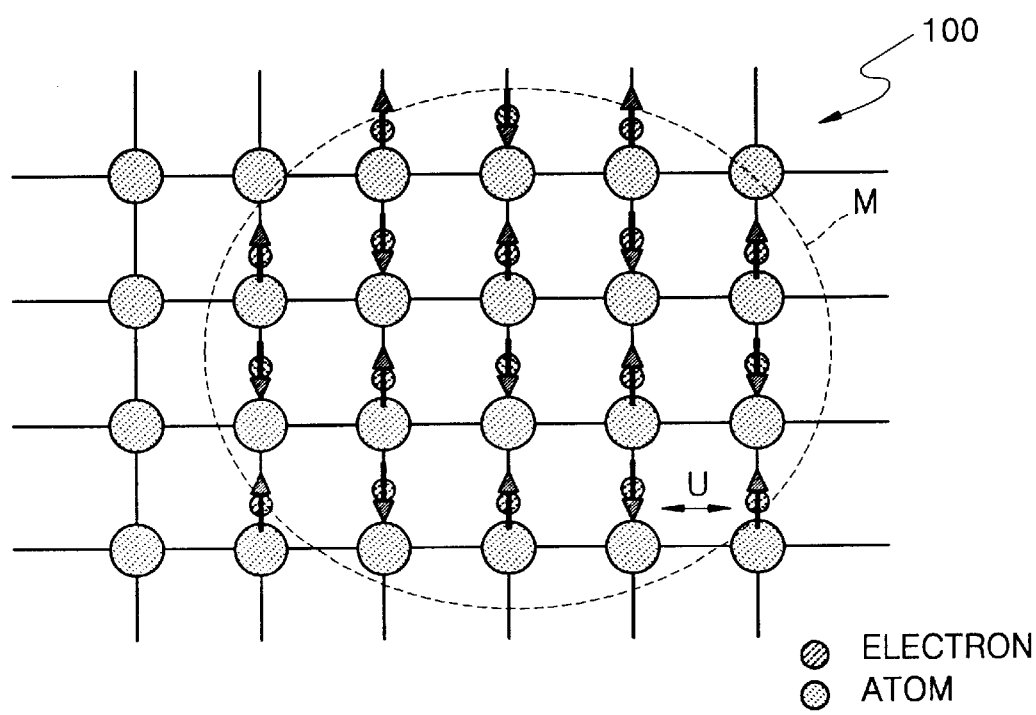

FIGS. 1A and 1B are diagrams showing atomic lattices within a Mott-Brinkman-Rice insulator having abrupt metal-insulator transition under predetermined conditions. The Mott-Brinkman-Rice insulator, that is, a paramagnetic insulator in reference "W. F. Brinkman, T. M. Rice, Phys. Rev.

B2, 4302 (1970)", is different from an antiferromagnetic insulator of the Mott-Hubbard insulator used by IBM group.

Referring to FIG. 1A, when an atom has two electrons and the intensity U of the repulsive Coulomb interaction between the two electrons is the same as the maximum Coulomb energy $U_c$ between the electrons, that is, $U/U_c=k=1$, the two electrons cannot exist in the atom together, so one of them moves to a neighboring atom and is bound to the neighboring atom. An insulator having such a bound and metallic electron structure is referred to as a Mott-Brinkman-Rice insulator 100.

If holes are added to the Mott-Brinkman-Rice insulator 100 at a very low concentration, the Mott-Brinkman-Rice insulator 100 is abruptly transformed into a metal due to a decrease in the Coulomb interaction and is thus changed into a non-uniform metallic system having both a metal phase and an insulator phase. Such abrupt transition, that is, first-order transition is well described in the reference "Hyun-Tak Kim in Physica C 341–348, 259 (2000); http://xxx.lanl.gov/abs/cond-mat/0110112". Here, the Mott-Brinkman-Rice insulator 100 is changed into a non-uniform metal system because the number of electrons becomes less than the number of atoms due to the addition of holes.

In this case, as shown in FIG. 1B, the intensity U of the repulsive Coulomb interaction becomes less than the maximum Coulomb energy $U_c$, that is, $U/U_c=k<1$. As a result, the Mott-Brinkman-Rice insulator 100 locally becomes a strong correlation metal (denoted by M in FIG. 1B) complying with the strong correlation metal theory of Brinkman and Rice. The strong correlation metal theory is well disclosed in the reference "W. F. Brinkman, T. M. Rice, Phys. Rev. B2, 4302 (1970)". Such a strong correlation metal has an electron structure in which one atom has one electron, that is, a metallic electron structure in which an s energy band is filled with one electron.

In the metal region M of FIG. 1B, the effective mass m*/m of a carrier is defined by Equation (2).

$$\frac{m^*}{m} = \frac{1}{1-k^2} \quad (2)$$

Here, k<1 is satisfied, and abrupt metal-insulator transition occurs at a value within a range between k=1 and a certain value close to k=1. This theoretical equation is introduced in the reference "W. F. Brinkman, T. M. Rice, Phys. Rev. B2, 4302 (1970)". The theory about a strong correlation was introduced in the reference "N. F. Mott, Metal-Insulator Transition, Chapter 3, (Taylor & Frances, 2nd edition, 1990) for the first time.

Meanwhile, the effective mass m*/m of a carrier in the entire metal system of FIG. 1B can be expressed by Equation (3).

$$\frac{m^*}{m} = \frac{1}{1-k^2\rho^4} \quad (3)$$

Here, ρ is a band filling factor and can be expressed by a ratio of the number of electrons (or carriers) to the number of atoms. In this case, when k=1, there occurs a abrupt transition from a value close to ρ=1 to ρ=1. This theory is well described in the reference "Hyun-Tak Kim in Physica C 341–348, 259 (2000); http://xxx.lanl.gov/abs/cond-mat/0110112".

For example, in the case of a material of $Sr_{1-x}La_xTiO_3$ (SLTO), $La^{+3}$ is substituted for $Sr^{+2}$ in an insulator of $SrTiO_3$(STO) when the material is doped with electrons, and in contrast, $Sr^{+2}$ is substituted for $La^{+3}$ in a Mott-Brinkman-Rice insulator of $LaTiO_3$(LTO) when the material is doped with holes.

Figure 2:
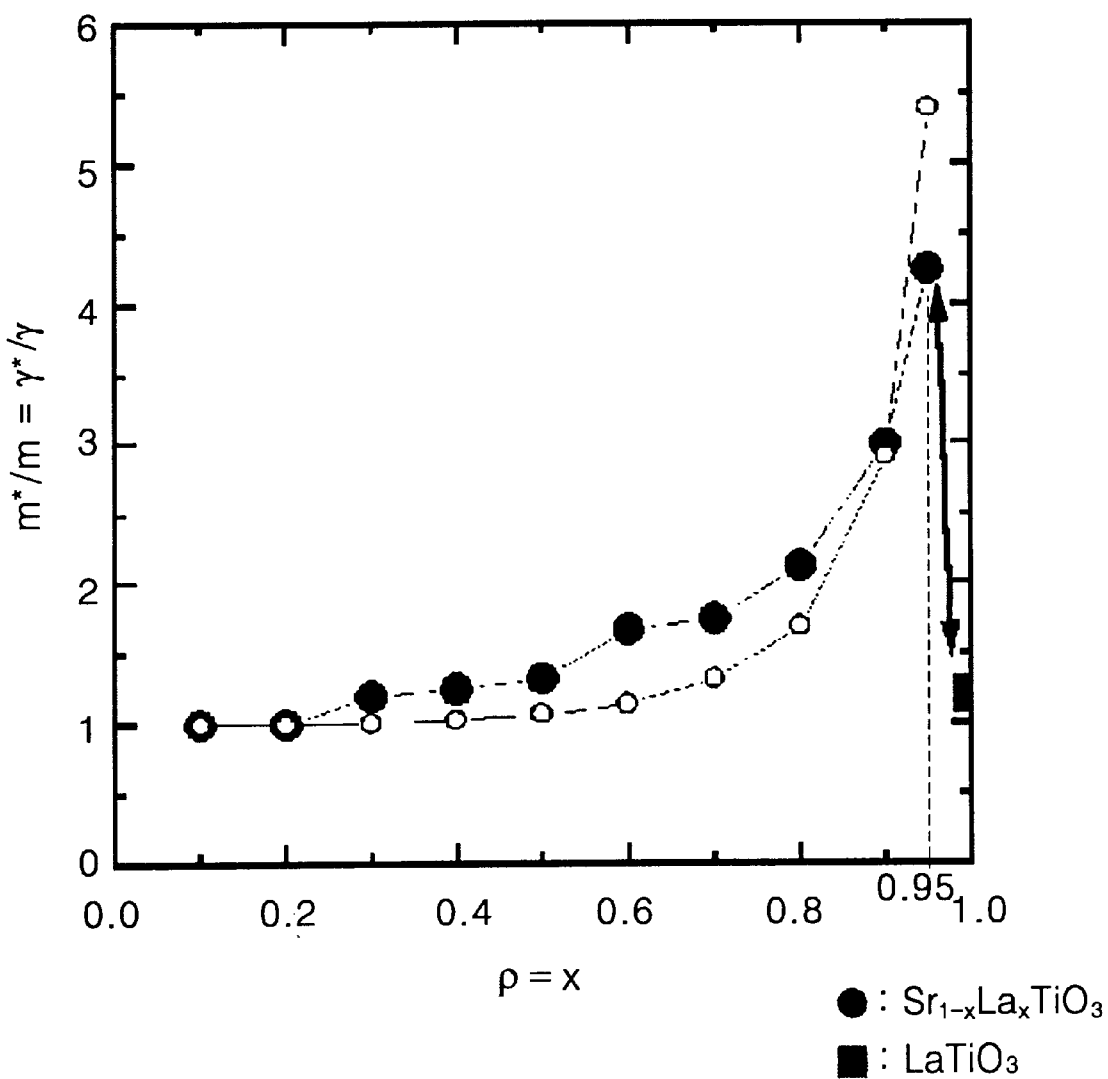
FIG. 2 is a graph showing the effective mass of a carrier versus the band filling factor of a Mott-Brinkman-Rice insulator of $LaTiO_3$(LTO)

FIG. 2 is a graph showing the effective mass of a carrier versus the ratio of $Sr^{+2}$ holes added to a Mott-Brinkman-Rice insulator of $LaTiO_3$(LTO), that is, a band filling factor ρ. As shown in FIG. 2, when k=1, there occurs abrupt transition from a metal having a maximum effective mass of a carrier to a Mott-Brinkman-Rice insulator (represented by an arrow in the graph) in a section from ρ=1 to ρ=0.95, that is, until the percentage of the $Sr^{+2}$ holes added to the Mott-Brinkman-Rice insulator of $LaTiO_3$(LTO) becomes 5%. Here, it was observed in a test that the quantity $N_c$ of electrons corresponding to ρ=0.95 was about $1.7\times10^{22}$ cm$^{-3}$. The result of the test is disclosed in references "Y. Tokura, Y, Taguchi, Y. Okada, Y. Fujishima, T. Arima, K. Kumagi, and Y. Iye, Phys. Rev. Lett. 70. 2126 (1993)" and "K. Kumagai, T. Suzuki, Y. Taguchi, Y. Okada, Y. Fumjishima, and Y. Tokura, Phys. Rev. B48, 7636 (1993)". When ρ<0.95, that is, when the quantity of added $La^{+3}$ electrons decreases or when the quantity of added $Sr^{+2}$ holes does not increase to at least 5%, continuous metal-insulator transition occurs due to a decrease in the number of carriers.

Figure 3:
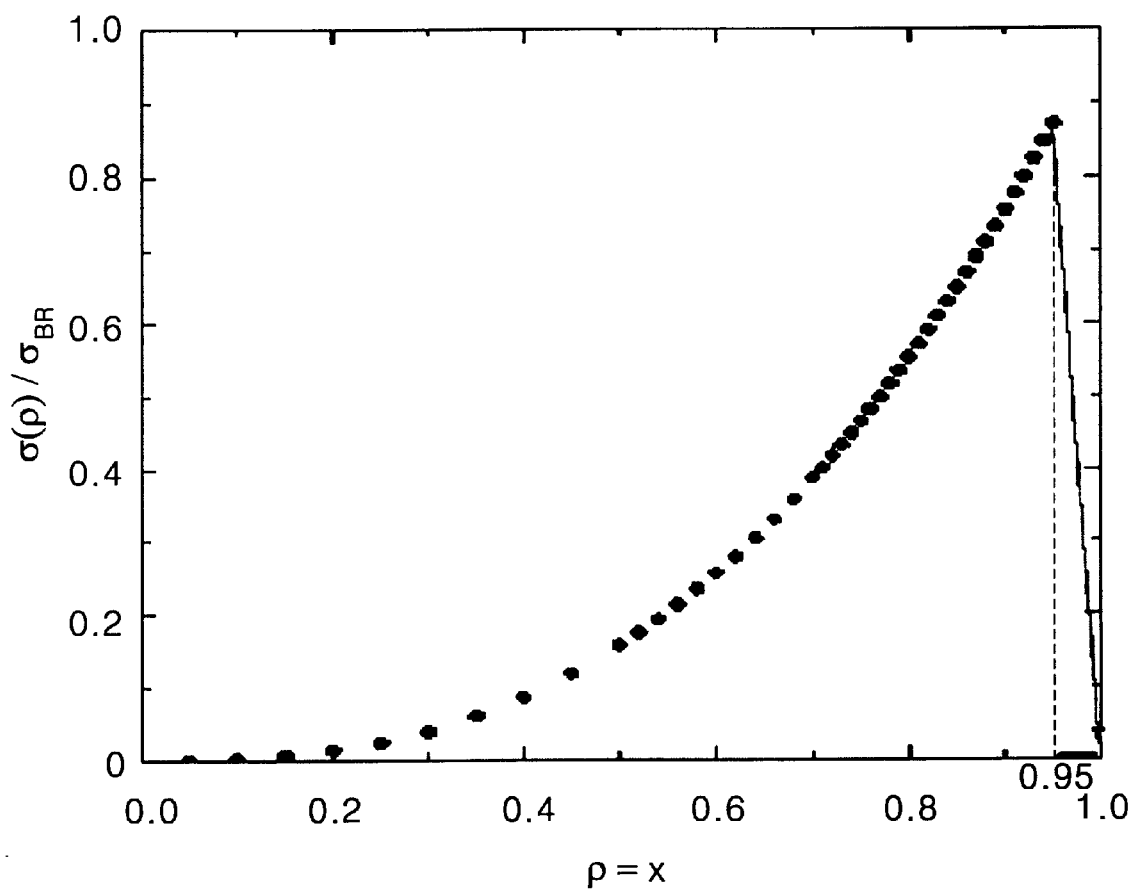
FIG. 3 is a graph showing electrical conductance $\sigma$ versus the band filling factor of a Mott-Brinkman-Rice insulator of $LaTiO_3$(LTO)

FIG. 3 is a graph showing electrical conductance σ versus the ratio of $Sr^{+2}$ holes added to a Mott-Brinkman-Rice insulator of $LaTiO_3$(LTO), that is, a band filling factor ρ. In FIG. 3, $\sigma_{BR}$ denotes the threshold electrical conductance of a metal.

As shown in FIG. 3, it was observed in a test that the electrical conductance sharply increases to a maximum value at ρ=0.95 in a section from ρ=1 to ρ=0.95, that is, until the percentage of the $Sr^{+2}$ holes added to the Mott-Brinkman-Rice insulator of $LaTiO_3$(LTO) becomes 5%. The result of the test is disclosed in references "Y. Tokura, Y, Taguchi, Y. Okada, Y. Fujishima, T. Arima, K. Kumagi, and Y. Iye, Phys. Rev. Lett. 70. 2126 (1993)" and "K. Kumagai, T. Suzuki, Y. Taguchi, Y. Okada, Y. Fumjishima, and Y. Tokura, Phys. Rev. B48, 7636 (1993)".

It can be concluded from the results of the tests shown in FIGS. 2 and 3 that adding holes to a Mott-Brinkman-Rice insulator of $LaTiO_3$(LTO) is more effective than adding electrons to an insulator of $SrTiO_3$(STO) in obtaining the maximum electrical conductance.

Figure 4:
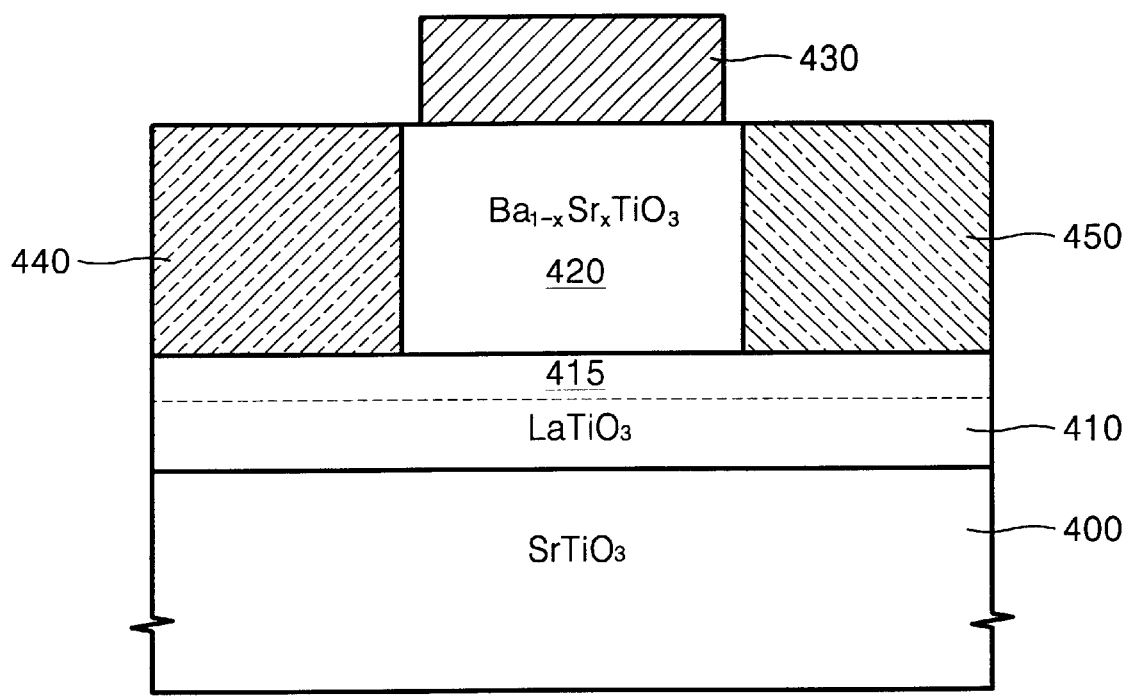
FIG. 4 is a sectional view of a switching field effect transistor according to the present invention.

FIG. 4 is a sectional view of a FET using abrupt metal-insulator transition according to the present invention. Referring to FIG. 4, a Mott-Brinkman-Rice insulator 410 of $LaTiO_3$(LTO) is disposed on a substrate 400 of $SrTiO_3$ (STO). The Mott-Brinkman-Rice insulator 410 may be formed of $LaTiO_3$, $YTiO_3$, $h-BaTiO_3$, $Ca_2RuO_4$, $Ca_2IrO_4$, $V_2O_3$, $(Cr_xV_{1-x})_2O_3$, $CaVO_3$, $SrVO_3$ and $YVO_3$. A dielectric (or ferroelectric) layer 420 having a dielectric constant of at least 200, for example, $Ba_{1-x}Sr_xTiO_3$(BSTO), is partially formed as a gate insulation layer on the surface of the Mott-Brinkman-Rice insulator 410. When a predetermined voltage is applied, the dielectric (or ferroelectric) layer 420 of $Ba_{1-x}Sr_xTiO_3$(BSTO) makes holes to add into the Mott-Brinkman-Rice insulator 410 so that abrupt metal-insulator transition can occur in the Mott-Brinkman-Rice insulator 410, thereby forming a conductive channel 415.

A gate electrode 430 is formed on the dielectric layer 420 to apply a predetermined voltage to the dielectric layer 420. A source electrode 440 is formed on a first portion of the Mott-Brinkman-Rice insulator 410, and a drain electrode 450 is formed on a second portion of the Mott-Brinkman-Rice insulator 410. The source electrode 440 and the drain electrode 450 are separated by the dielectric layer 420.

The following description concerns the operations of the FET. A predetermined voltage is applied to the source electrode 440 and the drain electrode 450, thereby generating a predetermined potential on the surface of the Mott-Brinkman-Rice insulator 410 of $LaTiO_3$(LTO). Next, a gate voltage is applied to the gate electrode 430 so that $Sr^{+2}$ holes can flow from the dielectric layer 420 of $Ba_{1-x}Sr_xTiO_3$ (BSTO) into a Mott-Brinkman-Rice insulator 410 at low concentration. Then, the Mott-Brinkman-Rice insulator 410 undergoes abrupt metal-insulator transition, and the conductive channel 415 is formed. As a result, current flows between the source electrode 440 and the drain electrode 450 through the conductive channel 415.

When the concentration of holes is 5%, that is, $\rho=0.95$, the number of electrons in a metal region formed due to the abrupt metal-insulator transition is about $4\times10^{14}/cm^2$. This number of electrons is about at least 100 times of the number of electrons (about $10^{12}/cm^2$) in a channel of a usual Metal Oxide Semiconductor Field Effect Transistor (MOSFET), so a high current amplification can be achieved.

According to circumstances, electrons can be added to the Mott-Brinkman-Rice insulator 410. However, the addition of electrons increases power consumption more than the addition of holes. In other words, when a gate voltage $V_g$ is 0.12 volts, the dielectric constant $\in$ of the dielectric layer 420 is 200, and the thickness "d" of the dielectric layer 420 is 50 nm, then the number $N_{charge}$ of static hole charges corresponding to a low concentration $\rho=0.95$ is about $4\times10^{14}/cm^2$ ($N_{charge}=V_g\in/ed$). Accordingly, if a hole concentration $N_{hole}$ is set to about $4\times10^{14}/cm^2$, and other variables, i.e., the dielectric constant $\in$ and the thickness "d" of the dielectric layer 420 are adjusted to the conditions of transistor fabrication, the gate voltage $V_g$ can be significantly decreased, so power consumption can be decreased.

However, when static electrons corresponding to a high concentration $\rho=0.95$ are added to the Mott-Brinkman-Rice insulator 410, the number $N_{electron}$ of electrons is more than the number $N_{hole}$ of holes. Accordingly, even if the dielectric constant $\in$ and the thickness "d" of the dielectric layer 420 are properly adjusted, the gate voltage $V_g$ becomes greater than in the case of adding holes. As a result, power consumption increases compared to the case of adding holes at a low concentration. In this specification, a transistor according to the present invention is referred to as a Mott-Gutzwiller-Brinkman-Rice-Kim (MGBRK) transistor in order to discriminate it from a Mott or Mott-Hubbard (MH) FET.

As described above, a FET according to the present invention provides the following effects. First, since a depletion layer does not exist, there is no limit in the length of a channel. Therefore, the degree of integration of a device and a switching speed can be greatly increased. Second, since a dielectric layer having a properly high dielectric constant is used as a gate insulator, an appropriate concentration of holes for doping can be obtained with a low voltage without greatly reducing the thickness of the dielectric layer. Third, when holes are added to a Mott-Brinkman-Rice insulator at a low concentration to provoke abrupt metal-insulator transition, a high current gain and a low power consumption can be achieved.

What is claimed is:

1. A switching field effect transistor comprising:

a substrate;

a Mott-Brinkman-Rice insulator formed on the substrate, the Mott-Brinkman-Rice insulator undergoing abrupt metal-insulator transition when holes add therein;

a dielectric layer formed on the Mott-Brinkman-Rice insulator, the dielectric layer adds holes into the Mott-Brinkman-Rice insulator when a predetermined voltage is applied thereto;

a gate electrode formed on the dielectric layer, the gate electrode applying the predetermined voltage to the dielectric layer;

a source electrode formed to be electrically connected to a first portion of the Mott-Brinkman-Rice insulator; and a drain electrode formed to be electrically connected to a second portion of the Mott-Brinkman-Rice insulator.

2. The switching field effect transistor of claim 1, wherein the substrate is formed of a material selected from the group consisting of $SrTiO_3$, Oxide materials, Silicon on Insulator (SOI), and Silicon.

3. The switching filed effect transistor of claim 1, wherein the Mott-Brinkman-Rice insulator is formed of a material selected from the group consisting of $LaTiO_3$, $YTiO_3$, and $R_{1-x}A_xTiO_3$ ($0 \leq x \leq 0.1$), where R is a cation with trivalent rare-earch ions (Y, La) and A is a cation with divalent alkali-earth ions (Ca, Sr).

4. The switching filed effect transistor of claim 1, wherein the Mott-Brinkman-Rice insulator is formed of a material, h-$BaTiO_3$.

5. The switching field effect transistor of claim 1, wherein the Mott-Brinkman-Rice insulator is formed of a material selected from the group consisting of $Ca_2RuO_4$, $Ca_{2-x}Sr_xRuO_4$($0 \leq x \leq 0.05$), $Ca_2IrO_4$, and $Ca_{2-x}Sr_xIrO_4$ ($0 \leq x \leq 0.05$).

6. The switching field effect transistor of claim 1, wherein the Mott-Brinkman-Rice insulator is formed of a material selected from the group consisting of $V_2O_3$, $(Cr_xV_{1-x})_2O_3$ ($0 \leq x 0.05$), $CaVO_3$, $Ca_{1-x}Sr_xVO_3$($0 \leq x \leq 0.05$), and $YVO_3$.

7. The switching field effect transistor of claim 1, wherein the dielectric layer is formed of $Ba_{1-x}Sr_xTiO_3$($0 \leq x \leq 0.05$), $Pb(Zr_{1-x}Ti_x)O_3$($0 \leq x \leq 0.05$), and $SrBi_2Ta_2O_9$.

8. The switching field effect transistor of claim 1, wherein the dielectric layer is formed of a material selected from the group consisting of $SiO_2$, $Si_3N_4$, $Al_2O_3$, $Y_2O_3$, $La_2O_3$, $Ta_2O_5$, $TiO_2$, $HfO_2$, $ZrO_2$.

9. The switching field effect transistor of claim 1, wherein the source electrode and the drain electrode are separated from each other by the dielectric layer.

* * * * *